United States Patent
Park et al.

(10) Patent No.: US 8,169,386 B2
(45) Date of Patent: May 1, 2012

(54) ORGANIC LIGHT EMITTING DIODE DISPLAY

(75) Inventors: Soon-Ryong Park, Yongin-si (KR);
Hee-Seong Jeong, Yongin-si (KR);
Woo-Suk Jung, Yongin-si (KR);
Hee-Chul Jeon, Yongin-si (KR);
Noh-Min Kwak, Yongin-si (KR);
Eun-Ah Kim, Yongin-si (KR); Joo-Hwa Lee, Yongin-si (KR); Chul-Woo Jeong, Yongin-si (KR); Jae-Yong Kim, Yongin-si (KR)

(73) Assignee: Samsung Mobile Display Co., Ltd., Yongin-si, Gyeonggi-do (KR)

( * ) Notice: Subject to any disclaimer, the term of this patent is extended or adjusted under 35 U.S.C. 154(b) by 439 days.

(21) Appl. No.: 12/508,438

(22) Filed: Jul. 23, 2009

(65) Prior Publication Data

US 2010/0045576 A1    Feb. 25, 2010

Related U.S. Application Data

(60) Provisional application No. 61/090,158, filed on Aug. 19, 2008.

(30) Foreign Application Priority Data

Feb. 5, 2009    (KR) .................. 10-2009-0009364

(51) Int. Cl.
*G09G 3/30* (2006.01)

(52) U.S. Cl. ............ 345/76; 362/800; 345/82; 345/205; 313/506

(58) Field of Classification Search .................... 345/76, 345/77, 80, 82, 83, 204, 205, 206; 313/503, 313/504, 505, 506, 113; 257/40, 59, 72, 257/642, 643, 759, E51.001–E51.052, E25.008–E25.009; 362/19, 800

See application file for complete search history.

(56) References Cited

U.S. PATENT DOCUMENTS 6,025,894 A * 2/2000 Shirasaki et al. ............... 349/69
(Continued)

FOREIGN PATENT DOCUMENTS

EP    0588504 A1    3/1994
(Continued)

OTHER PUBLICATIONS

European search report for European patent application No. 09166447.4-2203 dated Nov. 24, 2009 by European Patent Office.
(Continued)

*Primary Examiner* — Lun-Yi Lao
*Assistant Examiner* — Tom Sheng
(74) *Attorney, Agent, or Firm* — Knobbe, Martens, Olson & Bear LLP

(57) ABSTRACT

An organic light emitting diode display is disclosed. In one embodiment, the display includes 1) an organic light emitting diode comprising i) a pixel electrode, ii) an organic emission layer formed on the pixel electrode, and iii) a common electrode formed on the organic emission layer, 2) a dual brightness enhancement film formed over the common electrode of the organic light emitting diode, 3) a first phase delaying plate formed on the dual brightness enhancement film, 4) a corner cube film formed on the first phase delaying plate, 5) a second phase delaying plate formed on the corner cube film and a 6) polarizing plate formed on the second phase delaying plate, wherein at least one of the elements 2)-5) is configured to reduce reflection of external light incident onto the polarizing plate and/or reduce the loss of light emitted from the organic emission layer before outputting the emitted light through the polarizing plate.

20 Claims, 3 Drawing Sheets

U.S. PATENT DOCUMENTS

| | | | |
|---|---|---|---|
| 6,118,504 | A | 9/2000 | Iijima et al. |
| 6,169,708 | B1 | 1/2001 | Kaneko et al. |
| 6,297,864 | B1 | 10/2001 | Kaneko et al. |
| 6,624,936 | B2 | 9/2003 | Kotchick et al. |
| 6,774,962 | B2 | 8/2004 | Yoon |
| 6,787,976 | B2 | 9/2004 | Minoura et al. |
| 6,841,803 | B2 | 1/2005 | Aizawa et al. |
| 6,898,018 | B2 | 5/2005 | Minoura et al. |
| 7,176,619 | B2 * | 2/2007 | Miyachi et al. ............... 313/506 |
| 7,633,678 | B2 * | 12/2009 | Takahashi et al. ....... 359/485.01 |
| 7,712,908 | B2 * | 5/2010 | Hoshi et al. ...................... 362/19 |
| 7,804,244 | B2 * | 9/2010 | Ishitani et al. ................ 313/506 |
| 7,841,730 | B2 * | 11/2010 | Hara et al. ....................... 362/19 |
| 7,868,539 | B2 * | 1/2011 | Ohara ............................ 313/504 |
| 2002/0043931 | A1 * | 4/2002 | Minoura et al. ............. 313/506 |
| 2002/0122235 | A1 | 9/2002 | Kurtz et al. |
| 2003/0127656 | A1 | 7/2003 | Aizawa et al. |
| 2004/0051445 | A1 | 3/2004 | Adachi |
| 2004/0189167 | A1 | 9/2004 | Adachi et al. |
| 2005/0194896 | A1 * | 9/2005 | Sugita et al. .................. 313/506 |
| 2006/0145600 | A1 | 7/2006 | Yu et al. |
| 2006/0187384 | A1 | 8/2006 | Hisatake |
| 2007/0024777 | A1 | 2/2007 | Sawayama et al. |
| 2007/0085476 | A1 | 4/2007 | Hirakata et al. |
| 2007/0145889 | A1 | 6/2007 | Tamura et al. |
| 2007/0230211 | A1 | 10/2007 | Osato et al. |
| 2008/0123321 | A1 | 5/2008 | Hsu et al. |
| 2008/0144177 | A1 | 6/2008 | Miller |
| 2008/0157655 | A1 * | 7/2008 | Choi et al. .................... 313/504 |
| 2009/0290079 | A1 | 11/2009 | Evans et al. |

FOREIGN PATENT DOCUMENTS

| | | |
|---|---|---|
| EP | 0969296 A2 | 1/2000 |
| GB | 2437553 A | 10/2007 |
| JP | 06-109925 A | 4/1994 |
| JP | 06-235914 | 8/1994 |
| JP | 07-205322 (A) | 8/1995 |
| JP | 2001-357979 | 12/2001 |
| JP | 2002-198184 | 7/2002 |
| JP | 2003-121835 | 4/2003 |
| JP | 2003-186413 | 7/2003 |
| JP | 2003-186413 A | 7/2003 |
| JP | 2003-279988 (A) | 10/2003 |
| JP | 2003-315548 A | 11/2003 |
| JP | 2004-030955 A | 1/2004 |
| JP | 2004-070094 A | 3/2004 |
| JP | 2004-086145 | 3/2004 |
| JP | 2004-219825 A | 8/2004 |
| JP | 2004-296162 | 10/2004 |
| JP | 2004-296162 A | 10/2004 |
| JP | 2004-361774 A | 12/2004 |
| JP | 2005-108540 | 4/2005 |
| JP | 2006-343553 | 12/2006 |
| JP | 2006-343553 A | 12/2006 |
| JP | 2007-041536 (A) | 2/2007 |
| JP | 2007-141824 (A) | 6/2007 |
| KR | 10-2002-0003428 A | 1/2002 |
| KR | 2003-0038037 | 5/2003 |
| KR | 10-2003-0077402 A | 10/2003 |
| KR | 10-0454748 | 10/2004 |
| KR | 10-2005-0018401 A | 2/2005 |
| KR | 10-2005-0020332 A | 3/2005 |
| KR | 10-2005-0026863 A | 3/2005 |
| KR | 10-2005-0071387 A | 7/2005 |
| KR | 10-2005-0106004 A | 11/2005 |
| KR | 10-2006-0065729 A | 6/2006 |
| KR | 10-0606778 | 8/2006 |
| KR | 10-0706730 | 4/2007 |
| KR | 10-0714015 | 4/2007 |
| KR | 10-2007-0095826 A | 10/2007 |
| KR | 10-2008-0061791 A | 7/2008 |
| KR | 10-2008-0076384 A | 8/2008 |

OTHER PUBLICATIONS

European search report for European patent application No. 09166444.1-1235 dated Nov. 23, 2009 by European Patent Office.

The Extended European Search Report for European patent application No. 09168087.6-2203 dated Dec. 2, 2009 by European Patent Office.

Office Action dated Mar. 22, 2011 in related U.S. Appl. No. 12/508,426, filed Jul. 23, 2009.

Office Action dated Apr. 4, 2011 in related U.S. Appl. No. 12/508,409, filed Jul. 23, 2009.

Japanese Notice of Allowance dated Jan. 24, 2012 for Japanese Patent Application No. JP 2009-097936 which shares priority of Korean Patent Application No. KR 10-2009-0009364 with captioned U.S. Appl. No. 12/508,438.

* cited by examiner

ORGANIC LIGHT EMITTING DIODE DISPLAY

CROSS-REFERENCE TO RELATED APPLICATION

This application claims priority under 35 U.S.C. §119(e) from provisional application No. 61/090,158 filed on Aug. 19, 2008, which is incorporated herein by reference in its entirety.

This application also claims priority to and the benefit of Korean Patent Application No. 10-2009-0009364 filed in the Korean Intellectual Property Office on Feb. 5, 2009, the entire contents of which are incorporated herein by reference.

This application relates to 1) U.S. patent application entitled "ORGANIC LIGHT EMITTING DIODE DISPLAY" Ser. No. 12/508,409 and 2) U.S. patent application entitled "ORGANIC LIGHT EMITTING DIODE DISPLAY" Ser. No. 12/508,426, which are concurrently filed with this application and incorporated herein by reference in their entirety.

BACKGROUND OF THE INVENTION (a) Field of the Invention

The present invention relates to an organic light emitting diode display, and more particularly, to an organic light emitting diode display having improved display characteristics.

(b) Description of the Related Technology

An organic light emitting diode display includes a plurality of organic light emitting diodes that have hole injection electrodes, organic emission layers, and electron injection electrodes.

Light emission is performed by energy generated when excitons generated by a combination of electrons and holes inside the organic emission layer drops from an excited state to a ground state. The organic light emitting diode display forms images using this phenomenon.

Therefore, the organic light emitting diode display has a self-luminous characteristic and does not require a separate light source unlike a liquid crystal display, making it possible to reduce thickness and weight thereof.

Further, the organic light emitting diode display has high-quality characteristics such as low power consumption, high luminance, and high reaction speed, such that it is increasingly gaining attention as a next-generation display device for portable electronic devices.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

One aspect of the present invention is an organic light emitting diode display having an advantage of suppressing external light reflection to improve visibility and to minimize loss of light emitted to the outside from an organic emission layer.

Another aspect of the present invention is an organic light emitting diode display which includes: an organic light emitting diode that includes a pixel electrode, an organic emission layer formed on the pixel electrode, and a common electrode formed on the organic emission layer; a dual brightness enhancement film that is formed on the common electrode of the organic light emitting diode; a first phase delaying plate formed on the dual brightness enhancement film; a corner cube film formed on the first phase delaying plate; a second phase delaying plate formed on the corner cube film; and a polarizing plate formed on the second phase delaying plate.

The corner cube film may include a corner cube layer on which a plurality of corner cubes are formed and a cover layer covering one surface of the corner cube layer on which the corner cube is formed.

The corner cube of the corner cube layer may be formed to protrude toward the first phase delaying plate.

The corner cube layer may have a larger refractive index than the cover layer.

The cover layer may have adherence.

The cover layer may be disposed between the corner cube layer and the first phase delaying plate to adhere the corner cube layer to the first phase delaying plate.

At least two of the dual brightness enhancement film, the first phase delaying plate, the corner cube film, the second phase delaying plate, and the polarizing plate may be integrally formed.

In the organic light emitting diode display, the polarizing plate and the dual brightness enhancement film may have the same polarizing axis.

The first phase delaying plate and the second phase delaying plate may have the same optical axis and may be ¼ wavelength plates.

An intersecting angle between the optical axis of the first phase delaying plate and the second phase delaying plate and the polarizing axis of the polarizing plate and the dual brightness enhancement film may be 45°.

The organic light emitting diode display suppresses external light reflection, making it possible to improve visibility and to minimize loss of light emitted to the outside from an organic emission layer.

In other words, the display characteristic of the organic light emitting diode display can be improved.

Further, the organic light emitting diode display can reduce power consumption and improve lifespan thereof. Another aspect of the invention is an organic light emitting diode display, comprising: an organic light emitting diode comprising i) a pixel electrode, ii) an organic emission layer formed on the pixel electrode, and iii) a common electrode formed on the organic emission layer; a dual brightness enhancement film formed over the common electrode of the organic light emitting diode; a first phase delaying plate formed on the dual brightness enhancement film; a corner cube film formed on the first phase delaying plate; a second phase delaying plate formed on the corner cube film; and a polarizing plate formed on the second phase delaying plate, wherein at least one of i) the dual brightness enhancement film, ii) the first phase delaying plate, iii) the second phase delaying plate and iv) the corner cube film is configured to reduce reflection of external light incident onto the polarizing plate and/or reduce the loss of light emitted from the organic emission layer before outputting the emitted light through the polarizing plate.

In the above display, the corner cube film comprises a corner cube layer on which a plurality of corner cubes are formed, and a cover layer covering one surface of the corner cube layer on which the corner cubes are formed. In the above display, the corner cubes of the corner cube layer protrude toward the first phase delaying plate. The above display further comprises: a first substrate; a driving circuit interposed between the first substrate and the organic light emitting diode, wherein the driving circuit is configured to drive the organic light emitting diode; and a second substrate formed on the polarizing plate and configured to display images based on the linearly polarized light transmitted from the polarizing plate.

Another aspect of the invention is an organic light emitting diode display, comprising: an organic light emitting diode configured to emit first circularly polarized light; a dual brightness enhancement film formed over the organic light emitting diode, wherein the dual brightness enhancement film is configured to input the first circularly polarized light and output first linearly polarized light; a first phase delaying plate formed on the dual brightness enhancement film, wherein the first phase delaying plate is configured to input the first linearly polarized light and output second circularly polarized light; a corner cube film formed on the first phase delaying plate and configured to transmit the second circularly polarized light; a second phase delaying plate formed on the corner cube film, wherein the second phase delaying plate is configured to input the second circularly polarized light and output second linearly polarized light; and a polarizing plate formed on the second phase delaying plate and configured to transmit the second linearly polarized light.

In the above display, the dual brightness enhancement film is further configured to partially reflect circularly polarized light toward the organic light emitting diode. In the above display, the corner cube film comprises i) a corner cube layer facing the second phase delaying plate and ii) a cover layer contacting the corner cube layer and facing the first phase delaying plate, and wherein the corner cube layer has a larger refractive index than the cover layer. In the above display, the polarizing plate and the dual brightness enhancement film have the same polarizing axis. In the above display, the first phase delaying plate and the second phase delaying plate have the same optical axis and are ¼ wavelength plates.

Another aspect of the invention is an organic light emitting diode display, comprising: a polarizing plate configured to input external light and output first linearly polarized light; a first phase delaying plate configured to input the first linearly polarized light and output first circularly polarized light; a corner cube film configured to partially reflect and partially transmit the first circularly polarized light so as to output second circularly polarized light; a second phase delaying plate configured to input the second circularly polarized light and output second linearly polarized light; a dual brightness enhancement film configured to transmit the second linearly polarized light; and an organic light emitting diode comprising i) first and second electrodes and ii) an organic emission layer interposed between the first and second electrodes, wherein the second electrode faces the dual brightness enhancement film, and wherein the second electrode is configured to reflect the second linearly polarized light toward the dual brightness enhancement film.

In the above display, the first phase delaying plate is further configured to output the first circularly polarized light toward the corner cube film in a first direction, and wherein the corner cube film is further configured to partially reflect the first circularly polarized light toward the first phase delaying plate in a second direction substantially parallel with the first direction. In the above display, at least one of the polarizing plate and first phase delaying plate is further configured to absorb a substantial portion of the light partially reflected from the corner cube film. In the above display, the first phase delaying plate, the corner cube film, the second phase delaying plate and the dual brightness enhancement film are sequentially formed.

DETAILED DESCRIPTION OF CERTAIN INVENTIVE EMBODIMENTS

Figure 1:
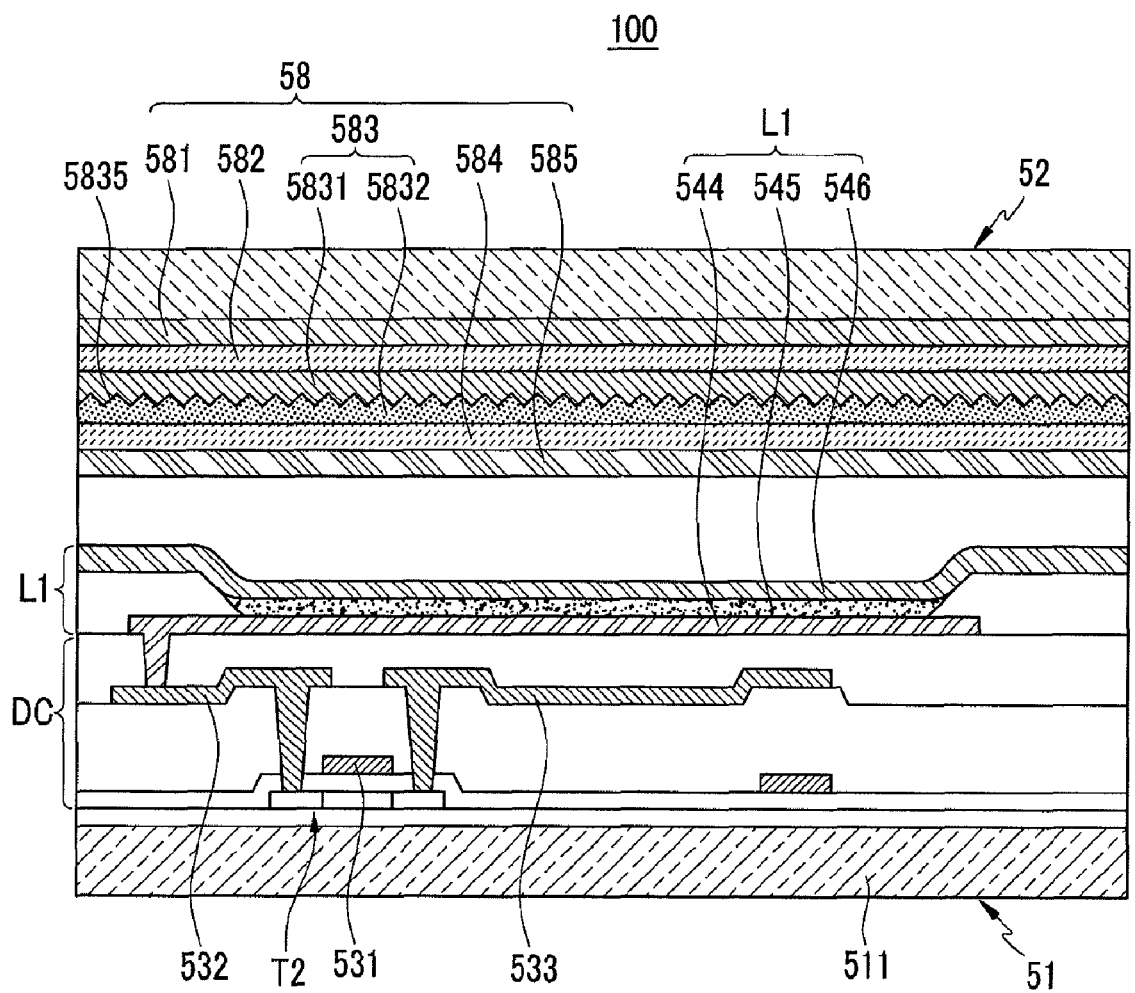
FIG. 1 is a partial cross-sectional view of an organic light emitting diode display according to an exemplary embodiment of the present invention.

Generally, at least one of the hole injection electrodes and the electron injection electrodes and several other metal wires that are included in the organic light emitting diode display can reflect light input from the outside.

Therefore, when the organic light emitting diode display is used in a bright place, there have been problems in that display of a black color and contrast are poor due to external light reflection.

In order to solve these problems, a configuration wherein a polarizing plate and a phase delaying plate are disposed to suppress the external light reflection has been developed.

However, when the external light reflection is suppressed by disposing the polarizing plate and the phase delaying plate, there is a problem in that light from the organic emission layer is significantly lost when it is emitted to the outside via the polarizing plate and the phase delaying plate.

Hereinafter, embodiments of the present invention will be described more fully with reference to the accompanying drawings, in which exemplary embodiments of the invention are shown. The present invention can be implemented in various forms, and thus the present invention is not limited to exemplary embodiments described herein.

Further, the size and thickness of each component shown in the drawings are arbitrarily shown for better understanding and ease of description, and thus the present invention is not limited to those shown in the drawings.

Moreover, in the drawings, the thickness of layers, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In embodiments of the present invention, parts that are not associated with the present invention will be omitted and the same or similar reference numerals refer to the same or similar constituent elements throughout the drawings.

Hereinafter, an exemplary embodiment of the present invention will be described with reference to referring to FIGS. 1 to 3.

As shown in FIG. 1, an organic light emitting diode display 100 includes a driving circuit (DC), an organic light emitting diode (L1), and an optical member 58.

The optical member 58 suppresses external light reflection to improve visibility of the organic light emitting diode display 100 and to minimize the loss of light emitted to the outside from the organic light emitting diode L1.

The optical member 58 includes a dual brightness enhancement film (DBEF) 585, a first phase delaying plate 584, a corner cube film 583, a second phase delaying plate 582, and a polarizing plate 581.

In one embodiment, as shown in FIG. 1, the dual brightness enhancement film 585, the first phase delaying plate 584, the corner cube film 583, the second phase delaying plate 582, and the polarizing plate 581 are sequentially disposed on the organic light emitting diode L1.

The driving circuit unit DC and the organic light emitting diode L1 are generally formed on or over the first substrate 51.

In other words, the first substrate 51 includes a substrate member 511, the driving circuit unit DC formed on the substrate member 511, and the organic light emitting diode L1 formed on the driving circuit unit DC.

Figure 2:
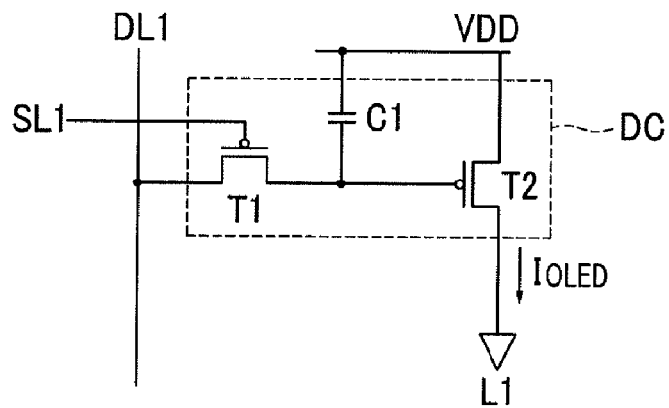
FIG. 2 is a layout view of a driving circuit unit of an organic light emitting diode display of FIG. 1 and a circuit layout of an organic light emitting diode thereof.

The driving circuit unit DC generally has a layout structure as shown in FIG. 2.

As shown in FIG. 2, the driving circuit unit DC includes two or more thin film transistors T1 and T2 and one or more storage capacitors C1.

The thin film transistor basically includes a switching transistor T1 and a driving transistor T2.

The switching transistor T1 is connected to a scan line SL1 and a data line DL1, and transmits a data voltage input from a data line DL1 to the driving transistor T2 according to a switching voltage input to the scan line SL1.

The storage capacitor C1 is connected to the switching transistor T1 and a power supply line VDD, and stores a voltage corresponding to a difference between a voltage transmitted from the switching transistor T1 and a voltage supplied to the power supply line VDD.

The driving transistor T2 is connected to the power supply line VDD and the storage capacitor C1 to supply an output current $I_{OELD}$ that is proportional to a square of a difference between a voltage stored in the storage capacitor C1 and a threshold voltage to the organic light emitting diode L1, and the organic light emitting diode L1 is light-emitted by the output current $I_{OLED}$.

Referring back to FIG. 1, the driving transistor T2 includes a source electrode 533, a drain electrode 532, and a gate electrode 531.

The organic light emitting diode L1 includes a pixel electrode 544, an organic emission layer 545 formed on the pixel electrode 544, and a common electrode 546 formed on the organic emission layer 545.

In one embodiment, the pixel electrode 544 is an anode and the common electrode 546 is a cathode.

In addition, the pixel electrode 544 of the organic light emitting diode L1 is connected to the drain electrode 532 of the driving transistor T2.

In one embodiment, at least one of the pixel electrode 544 and the common electrode 546 is formed as a semi-transmissive type or a reflective type, making it possible to reflect light.

The configuration of the driving circuit unit DC and the organic light emitting diode L1 is not limited to the foregoing example and can be variously modified in a known configuration that can be easily carried out by those skilled in the art.

The polarizing plate 581 has a polarizing axis to linearly polarize light.

In one embodiment, the polarizing plate 581 passes light meeting the polarizing axis and absorbs light that does not meet the polarizing axis.

In this embodiment, if light passes through the polarizing plate 581, it is linearly polarized in a polarizing axis direction of the polarizing plate 581.

The first phase delaying plate 584 and the second phase delaying plate 582 change a phase of passed light. In one embodiment, the first phase delaying plate 584 and the second phase delaying plate 582 use a ¼ wavelength plate and change linear polarization into circular polarization.

In one embodiment, the dual brightness enhancement film (DBEF) 585 passes light meeting the polarizing axis but reflects light that does not meet the polarizing axis.

The polarizing plate 581 may be different from the dual brightness enhancement film 585 in that it absorbs light not meeting the optical axis.

In an exemplary embodiment of the present invention, the dual brightness enhancement film 585 may have the same polarizing axis as the polarizing axis of the polarizing plate 581.

Further, the first phase delaying plate 584 and the second phase delaying plate 582 are arranged so that the linearly polarized light passing through the polarizing plate 581 may be the right circular polarized light while it passes through the second phase delaying plate 582 and the right circular polarized light may have the same linear polarization as the linearly polarized light passing through the polarizing plate 581 again while it passes through the first phase polarizing plate 584.

Further, the dual brightness enhancement film 585, the first phase delaying plate 584, the second phase delaying plate 582, and the polarizing plate 581 may be arranged to satisfy the following conditions.

Light becomes linearly polarized while it passes through the polarizing plate 581 and the linearly polarized light becomes the right circular polarized light while it passes through the second phase delaying plate 582.

This right circular polarized light becomes linearly polarized while it passes through the first phase delaying plate 584 again and the linear polarized light should be able to pass through the dual brightness enhancement film 585 as it is.

Further, light should be able to pass without any loss in a reverse order of the foregoing order.

The corner cube film 583 includes a corner cube layer 5831 on which a plurality of corner cubes 5835 are formed, and a cover layer 5832 that covers one surface of the corner cube layer 5831 on which the corner cubes 5835 are formed.

The cover layer 5832 is formed to be closely adhered to the corner cubes 5835.

The corner cubes 5835 on the corner cube layer 5831 are formed to protrude toward the first phase delaying plate 584.

In other words, the cover layer 5832 that covers the corner cube layer 5831 is disposed between the corner cube layer 5831 and the first phase delaying plate 584.

In one embodiment, the corner cube layer 5831 has a larger refractive index than the cover layer 5832.

The cover layer 5832 may be made of a material having a smaller refractive index than the corner cube layer 5831.

Figure 3:
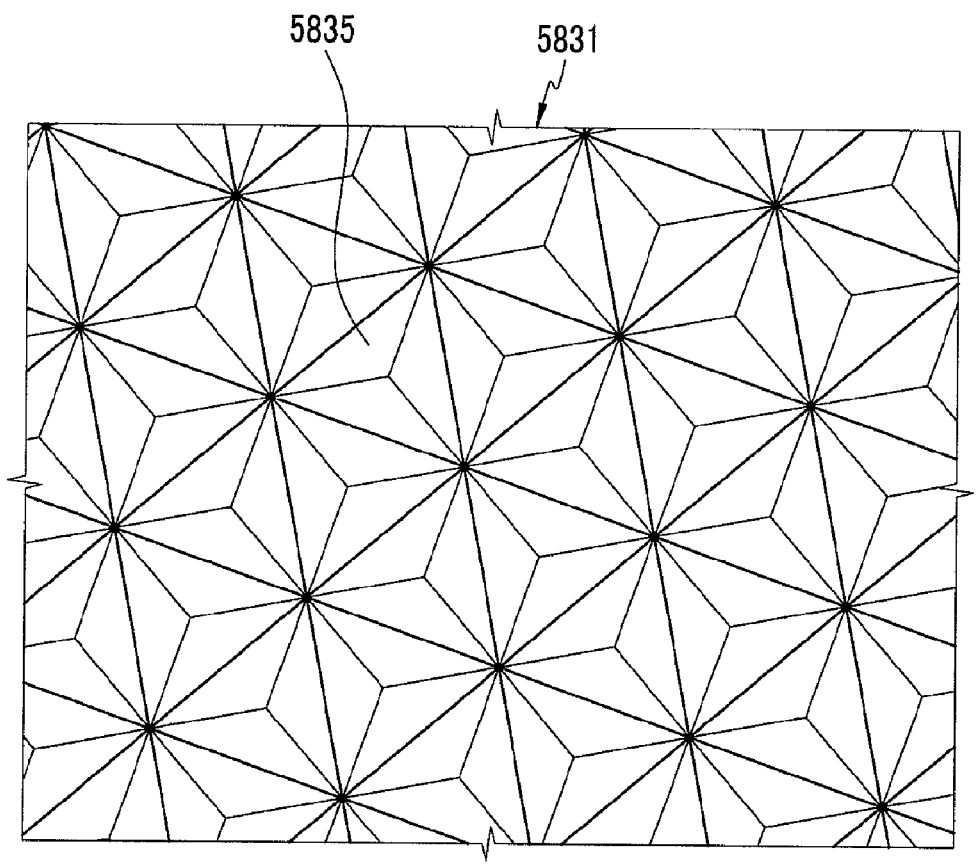
FIG. 3 is a top plan view showing a corner cube layer used for the organic light emitting diode display of FIG. 1.

In one embodiment, as shown in FIG. 3, the corner cubes 5835 are formed in a triangular pyramid shape.

In this embodiment, each corner cube 5835 has a shape where a regular hexahedral edge is cut. The plurality of corner cubes 5835 are formed on one surface of the corner cube layer 5831 in a fine pattern.

The cube layer 5831 formed as above reflects light in a direction substantially parallel with an incident direction. In other words, if light is incident on the corner cube layer 5831, light is reflected towards the incident direction. A material having a lower refractive index than that of the corner cube layer 5831 adjoins an opposite surface to the surface of the corner cube layer 5831 on which light is incident.

Meanwhile, in the corner cube film 583, the cover layer 5832 having a lower refractive index than the corner cube layer 5831 adjoins one surface of the corner cube layer 5831. In such a structure, light emitted toward the corner cube layer 5831 from the cover layer 5832 passes through the corner cube film 583 as it is and light emitted toward the cover layer 5832 from the corner cube layer 5831 is reflected toward the direction where light is incident on the corner cube layer 5831.

In one embodiment, when the external light is incident on the corner cube film 583 via the polarizing plate 581 and the second phase delaying plate 582, it is reflected in substantially parallel with the incident direct toward the incident direction. At this time, at least a portion of light reflected from the corner cube film 583 is lost when it sequentially passes through the second phase delaying plate 582 and the polarizing plate 581 again. Further, light emitted toward the outside via the polarizing plate 581 without any loss is also reflected in an incident direction, such that the reflected external light reflected toward a user looking at the organic light emitting diode display 100 is suppressed. In other words, the visibility of the organic light emitting diode display 100 is improved.

Further, the cover layer 5832 of the corner cube film 583 may have adherence and the cover layer 5832 may adhere the corner cube layer 5831 to the first phase delaying plate 584. In other words, the corner cube film 583 and the first phase delaying plate 584 may be integrally formed with each other. Moreover, two or more of the dual brightness enhancement film 585, the first phase delaying plate 584, the corner cube film 583, the second phase delaying plate 582, and the polarizing plate 581 may be integrally formed.

The second substrate 52 covers the first substrate 51 on which the organic light emitting diode L1 and the driving circuit unit DC are formed. Further, the second substrate 52 also covers the optical member 58 formed on the organic light emitting diode L1. However, the present invention is not limited thereto. Therefore, the optical member 58 may be formed on the second substrate 52. In other words, the optical member 58 may be freely disposed over the organic light emitting diode L1.

By the foregoing configuration, the organic light emitting diode display 100 effectively suppresses the external light reflection, making it possible to improve visibility and to minimize the loss of light emitted to the outside from the organic emission layer 545. In other words, the display characteristics of the organic light emitting diode display 100 can be improved.

In addition, the organic light emitting diode display 100 can effectively emit light generated from the organic emission layer 545, making it possible to reduce power consumption and to improve the lifespan thereof.

Figure 4:
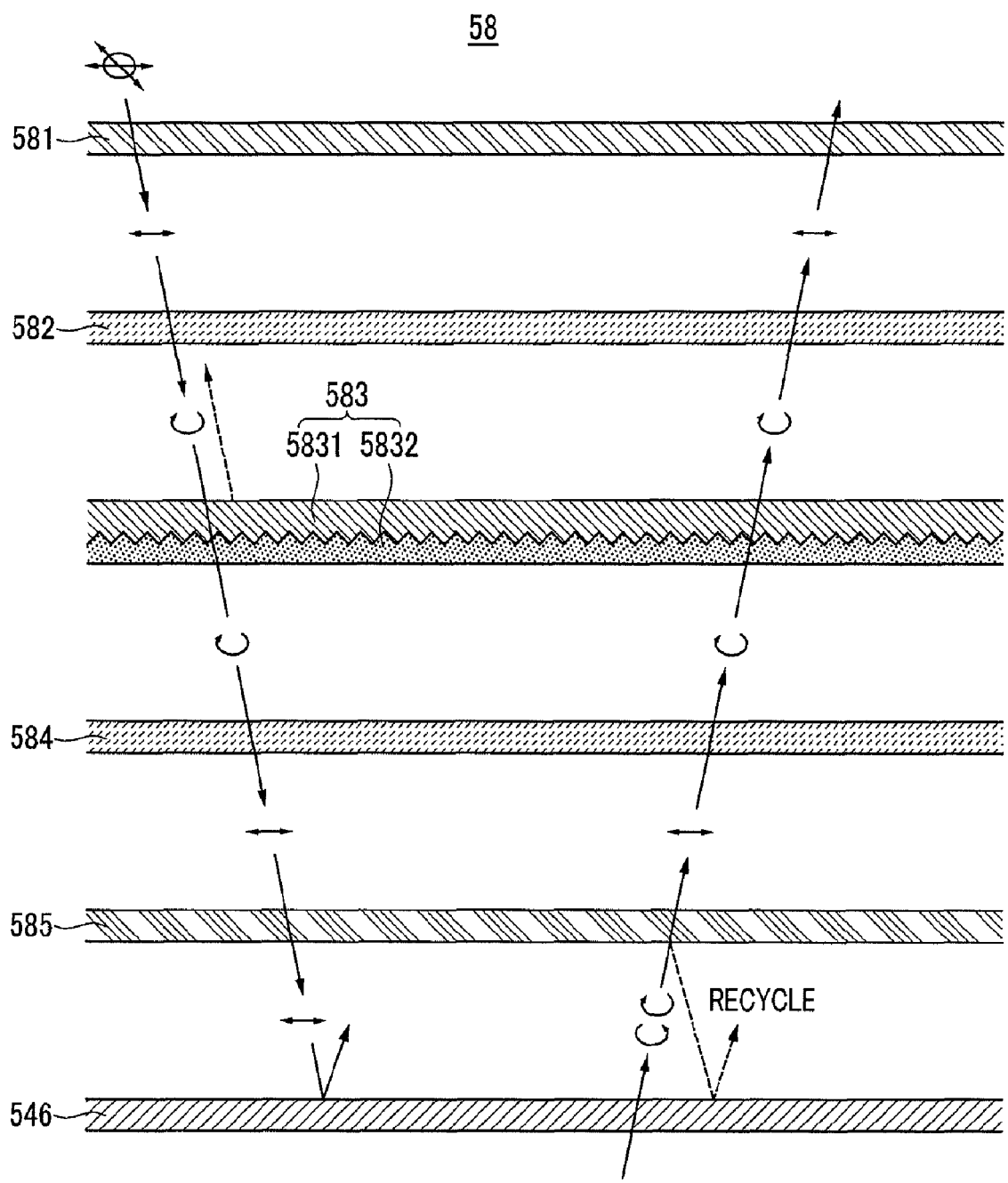
FIG. 4 is a cross-sectional view showing a path of light flowing in the organic light emitting diode device of FIG. 1 from the outside and a path of light generated from the organic light emitting diode device to the outside.

Hereinafter, referring to FIG. 4, a principle of suppressing the external light reflection inside the organic light emitting diode display 100 and minimizing the loss of light emitted from the organic emission layer 545 (shown in FIG. 1) to the outside will be described in detail.

First, a path of light emitted from the organic emission layer 545 (shown in FIG. 1) to the outside will be described as follows.

Light emitted from the organic emission layer 545 (shown in FIG. 1) is linearly polarized when it passes through the dual brightness enhancement film 585, and the linear polarization becomes circular polarization when it passes through the first phase delaying plate 584 again. At this time, light that does not pass through the dual brightness enhancement film 585 is circulated while being continuously reflected between the dual brightness enhancement film 585 and the common electrode 546.

In other words, a portion of light that is reflected from the common electrode 546 and progresses to the dual brightness enhancement film 585 again is linearly polarized and passes through, and the remaining light is continuously and repeatedly reflected. Further, FIG. 4 shows that light is reflected between the dual brightness enhancement film 585 and the common electrode 546, but it is not limited thereto.

Therefore, light may be reflected between the dual brightness enhancement film 585 and the pixel electrode 544 (shown in FIG. 1).

In addition, the linearly polarized light passing through the dual brightness enhancement film 585 is changed into the circularly polarized light while it passes through the first phase delaying plate 584.

This circularly polarized light passes through the corner cube film 583 as it is.

The corner cube film 583 includes a cover layer 5832 that has a low refractive index and faces the first phase delaying plate 584, and a corner cube layer 5831 that has a high refractive index and is adhered just above the cover layer 5832.

Therefore, almost all of the light that progresses to the corner cube film 583 from the first phase delaying plate 584 is not reflected but passes through.

The circularly polarized light passing through the corner cube film 583 becomes the linear polarized light again while it passes through the second phase delaying plate 582.

The linearly polarized light may progress to the outside through the polarizing plate 581 via the optical axis arrangement among the dual brightness enhancement film 585, the first phase delaying plate 584, the second phase delaying plate 582, and the polarizing plate 581 as it is.

In detail, the polarizing plate 581 and the dual brightness enhancement film 585 have the same polarization axis, and the first phase delaying plate 584 and the second phase delaying plate 582 have the same optical axis.

Further, the intersecting angle between the optical axis of the first phase delaying plate 584 and the second phase delaying plate 582 and the polarizing axis of the polarizing plate 581 and the dual brightness enhancement film 588 is 45°.

Therefore, the loss of light generated from the organic light emitting diode L1 can be minimized when light is emitted to the outside through the optical member 58.

Next, a path of light input from the outside will be described as follows.

Light from the outside is linearly polarized in a polarizing axis direction of the polarizing plate 581 while it passes through the polarizing plate 581.

The linear polarization becomes the right circularly polarized light while it passes through the second phase delaying plate 582 (or a first phase delaying plate) and progresses to the corner cube film 583.

The corner cube film 583 reflects a considerable portion of light incident through the polarizing plate 581 and the second phase delaying plate 582 in substantially parallel with the incident direction.

The remaining portion of light progresses to the first phase delaying plate 584.

A considerable amount of light reflected from the corner cube film 583 is lost while it passes through the second phase delaying plate 582 and the polarizing plate 581 or is reflected in parallel with the incident direction.

Therefore, from the viewpoint of a user looking at the organic light emitting diode display 100, the deterioration of visibility due to the external light reflection can be effectively suppressed.

Meanwhile, light passing through the corner cube film 583 is linearly polarized while it passes through the first phase delaying plate 584 (or a second phase delaying plate).

The linearly polarized light progresses to the common electrode 546 through the dual brightness enhancement film 585.

As such, a considerable portion of light input from the outside is reflected from the corner cube film 583 and the external reflection can be suppressed.

The organic light emitting diode display 100 effectively suppresses the external light reflection, making it possible to improve visibility and to minimize loss of light emitted to the outside from an organic emission layer 545.

In other words, the display characteristic of the organic light emitting diode display 100 can be improved.

Further, the organic light emitting diode display 100 can effectively emit light generated from the organic light emitting diode L1 to the outside, making it possible to reduce power consumption and to improve the lifespan thereof.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display, comprising:
    an organic light emitting diode comprising i) a pixel electrode, ii) an organic emission layer formed on the pixel electrode, and iii) a common electrode formed on the organic emission layer;
    a dual brightness enhancement film formed over the common electrode of the organic light emitting diode;
    a first phase delaying plate formed on the dual brightness enhancement film;
    a corner cube film formed on the first phase delaying plate;
    a second phase delaying plate formed on the corner cube film; and
    a polarizing plate formed on the second phase delaying plate, wherein at least one of i) the dual brightness enhancement film, ii) the first phase delaying plate, iii) the second phase delaying plate and iv) the corner cube film is configured to reduce reflection of external light incident onto the polarizing plate and/or reduce the loss of light emitted from the organic emission layer before outputting the emitted light through the polarizing plate.

2. The organic light emitting diode display of claim 1, wherein the corner cube film comprises a corner cube layer on which a plurality of corner cubes are formed, and a cover layer covering one surface of the corner cube layer on which the corner cubes are formed.

3. The organic light emitting diode display of claim 2, wherein the corner cubes of the corner cube layer protrude toward the first phase delaying plate.

4. The organic light emitting diode display of claim 3, wherein the corner cube layer has a larger refractive index than the cover layer.

5. The organic light emitting diode display of claim 2, wherein the cover layer has adherence.

6. The organic light emitting diode display of claim 5, wherein the cover layer is disposed between the corner cube plate and the first phase delay layer to adhere the corner cube layer to the first phase delaying plate.

7. The organic light emitting diode display of claim 1, wherein at least two of the dual brightness enhancement film, the first phase delaying plate, the corner cube film, the second phase delaying plate, and the polarizing plate are integrally formed.

8. The organic light emitting diode display of claim 1, wherein the polarizing plate and the dual brightness enhancement film have the same polarizing axis.

9. The organic light emitting diode display of claim 8, wherein the first phase delaying plate and the second phase delaying plate have the same optical axis and are ¼ wavelength plates.

10. The organic light emitting diode display of claim 9, wherein an intersecting angle between the optical axis of the first phase delaying plate and the second phase delaying plate and the polarizing axis of the polarizing plate and the dual brightness enhancement film is 45°.

11. The organic light emitting diode display of claim 1, further comprising:
    a first substrate;
    a driving circuit interposed between the first substrate and the organic light emitting diode, wherein the driving circuit is configured to drive the organic light emitting diode; and
    a second substrate formed on the polarizing plate and configured to display images based on the linearly polarized light transmitted from the polarizing plate.

12. An organic light emitting diode display, comprising:
    an organic light emitting diode configured to emit first circularly polarized light;
    a dual brightness enhancement film formed over the organic light emitting diode, wherein the dual brightness enhancement film is configured to input the first circularly polarized light and output first linearly polarized light;
    a first phase delaying plate formed on the dual brightness enhancement film, wherein the first phase delaying plate is configured to input the first linearly polarized light and output second circularly polarized light;
    a corner cube film formed on the first phase delaying plate and configured to transmit the second circularly polarized light;
    a second phase delaying plate formed on the corner cube film, wherein the second phase delaying plate is configured to input the second circularly polarized light and output second linearly polarized light; and
    a polarizing plate formed on the second phase delaying plate and configured to transmit the second linearly polarized light.

13. The organic light emitting diode display of claim 12, wherein the dual brightness enhancement film is further configured to partially reflect circularly polarized light toward the organic light emitting diode.

14. The organic light emitting diode display of claim 12, wherein the corner cube film comprises i) a corner cube layer facing the second phase delaying plate and ii) a cover layer contacting the corner cube layer and facing the first phase delaying plate, and wherein the corner cube layer has a larger refractive index than the cover layer.

15. The organic light emitting diode display of claim 12, wherein the polarizing plate and the dual brightness enhancement film have the same polarizing axis.

16. The organic light emitting diode display of claim 12, wherein the first phase delaying plate and the second phase delaying plate have the same optical axis and are ¼ wavelength plates.

17. An organic light emitting diode display, comprising:
    a polarizing plate configured to input external light and output first linearly polarized light;
    a first phase delaying plate configured to input the first linearly polarized light and output first circularly polarized light;
    a corner cube film configured to partially reflect and partially transmit the first circularly polarized light so as to output second circularly polarized light;

a second phase delaying plate configured to input the second circularly polarized light and output second linearly polarized light;

a dual brightness enhancement film configured to transmit the second linearly polarized light; and an organic light emitting diode comprising i) first and second electrodes and ii) an organic emission layer interposed between the first and second electrodes, wherein the second electrode faces the dual brightness enhancement film, and wherein the second electrode is configured to reflect the second linearly polarized light toward the dual brightness enhancement film.

18. The organic light emitting diode display of claim 17, wherein the first phase delaying plate is further configured to output the first circularly polarized light toward the corner cube film in a first direction, and wherein the corner cube film is further configured to partially reflect the first circularly polarized light toward the first phase delaying plate in a second direction substantially parallel with the first direction.

19. The organic light emitting diode display of claim 17, wherein at least one of the polarizing plate and first phase delaying plate is further configured to absorb a substantial portion of the light partially reflected from the corner cube film.

20. The organic light emitting diode display of claim 17, wherein the first phase delaying plate, the corner cube film, the second phase delaying plate and the dual brightness enhancement film are sequentially formed.

* * * * *